(12) United States Patent
Ha et al.

(10) Patent No.: US 7,419,378 B2
(45) Date of Patent: Sep. 2, 2008

(54) SOCKET FOR TESTING SEMICONDUCTOR PACKAGE

(75) Inventors: Seoung-Su Ha, Chungcheongnam-do (KR); Jin-Won Kang, Chungcheongnam-do (KR); Jung-Hyeon Kim, Gyeonggi-do (KR); Se-Jun Yu, Chungcheongnam-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/940,044

(22) Filed: Nov. 14, 2007

(65) Prior Publication Data

US 2008/0113524 A1    May 15, 2008

(30) Foreign Application Priority Data

Nov. 14, 2006    (KR)    ............... 10-2006-0112453

(51) Int. Cl.
*H01R 11/30*    (2006.01)
(52) U.S. Cl. .......................................... 439/39; 439/66
(58) Field of Classification Search ............. 439/38–40, 439/950, 305
See application file for complete search history.

(56) References Cited

U.S. PATENT DOCUMENTS 7,097,461 B2 *    8/2006    Neidlein ..................... 439/66

7,190,180 B2 *    3/2007    Yamada et al. ............... 324/754
2007/0134947 A1 *    6/2007    Neidlein ....................... 439/66

FOREIGN PATENT DOCUMENTS

| JP | 2006-084252 | 3/2006 |
| KR | 2002-0024419 | 3/2002 |
| KR | 2002-0037484 | 5/2002 |

OTHER PUBLICATIONS

English language abstract of Korean Publication No. 2002-0024419.
English language abstract of Korean Publication No. 2002-0037484.
English language abstract of Japanese Publication No. 2006-084252.

* cited by examiner

*Primary Examiner*—Hae Moon Hyeon
(74) *Attorney, Agent, or Firm*—Marger Johnson & McCollom, P.C.

(57) ABSTRACT

Example embodiments of the present invention include a socket for testing a semiconductor package. The socket comprises a body having a through hole. A lower magnet is disposed in a lower region of the through hole, and a first type magnetic pole of the lower magnet is directed upward. An upper magnet is disposed in an upper region of the through hole, wherein the first type magnetic pole of the upper magnet is directed toward the lower magnet. The upper and lower magnets are structured to absorb a shock wave which is generated when the semiconductor package is arranged for testing. A conductive medium is disposed between the lower magnet and the upper magnet to electrically couple contactors of the semiconductor package to a base substrate of the socket.

26 Claims, 5 Drawing Sheets

SOCKET FOR TESTING SEMICONDUCTOR PACKAGE

CROSS-REFERENCE TO RELATED PATENT APPLICATION

This application claims the benefit of Korean Patent Application No. 10-2006-0112453, filed on Nov. 14, 2006, in the Korean Intellectual Property Office, the disclosure of which is incorporated herein in its entirety by reference.

BACKGROUND OF THE INVENTION

1. Field of the Invention

The present invention relates to a socket, and more particularly, to a socket for testing a semiconductor package.

2. Description of the Related Art

Generally, semiconductor packages are subjected to a final electrical testing procedure after being manufactured and prior to shipment. In this testing procedure, the semiconductor package is mounted on a test circuit substrate, which is coupled to testing equipment. In this context, a device for electrically coupling the semiconductor package to the test circuit substrate is referred to as a "socket."

Recently, in order to make the semiconductor package light-weight, thin, short, and miniaturized, and to improve an electrical characteristic of the semiconductor package, use of a solder ball package, such as a ball grid array (BGA) package (e.g., a solder ball as mounting means for the semiconductor package), has increased.

The socket which is used to electrically couple such a BGA package to the test circuit substrate may employ one of two connection methods. One is a pogo pin method, which uses a pin in which a spring is embedded as a contactor. The other is a conductive rubber method which uses a conductive rubber as a conductive contactor. However, the pogo pin method is disadvantageous in that the solder ball is damaged when the pogo pin is coupled to the solder ball. And the conductive rubber method is disadvantageous in that the time in which the conductive rubber loses its elasticity and becomes deformed, is short.

SUMMARY OF THE INVENTION

Example embodiments of the present invention provide a socket for testing a semiconductor package including a contactor having an increased lifespan, thus reducing damage to contactors of the socket and the semiconductor package.

An example embodiment of the present invention includes a body including a through hole; a first magnet disposed in a first region of the through hole such that a first type magnetic pole of the first magnet is directed in a first direction; a second magnet disposed in a second region of the through hole such that the first type magnetic pole of the second magnet is directed in a second direction; and a conductive medium disposed between the first magnet and the second magnet.

Another example embodiment of the present invention comprises a body including a through hole; a lower magnet disposed in a lower region of the through hole such that a first type magnetic pole of the lower magnet is directed upward; an upper magnet disposed in an upper region of the through hole such that the first type magnetic pole of the upper magnet is directed toward the lower magnet; an upper conductive cushion which is disposed on an upper surface of the upper magnet; a lower conductive cushion which is disposed on a lower surface of the lower magnet; and a conductive medium disposed between the lower magnet and the upper magnet.

BRIEF DESCRIPTION OF THE DRAWINGS

The above and other features, objects, and advantages of the present invention will become more apparent by describing in detail exemplary embodiments thereof with reference to the attached drawings in which.

DETAILED DESCRIPTION OF THE INVENTION

Example embodiments of the present invention will be described more fully hereinafter with reference to accompanying drawings. The present invention, however, is not defined by these embodiments set forth herein and may be embodied in many different forms. Rather, embodiments which are disclosed herein are provided so that the disclosed contents are thoroughly and completely appreciated and the spirit of the present invention is fully conveyed to those of ordinary skill in the art. In the drawings, the thickness of the layer and regions is exaggerated for clarity. Like numerals refer to like elements throughout the specification.

Figure 1A:
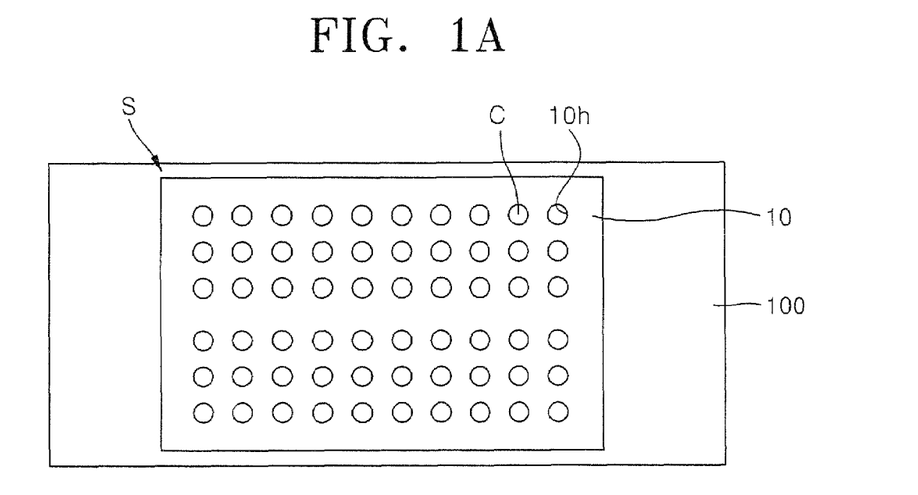
FIG. 1A and FIG. 1B show a plane view and a cross-sectional view, respectively, of a socket for testing a semiconductor package according to an example embodiment of the present invention.
Figure 1B:
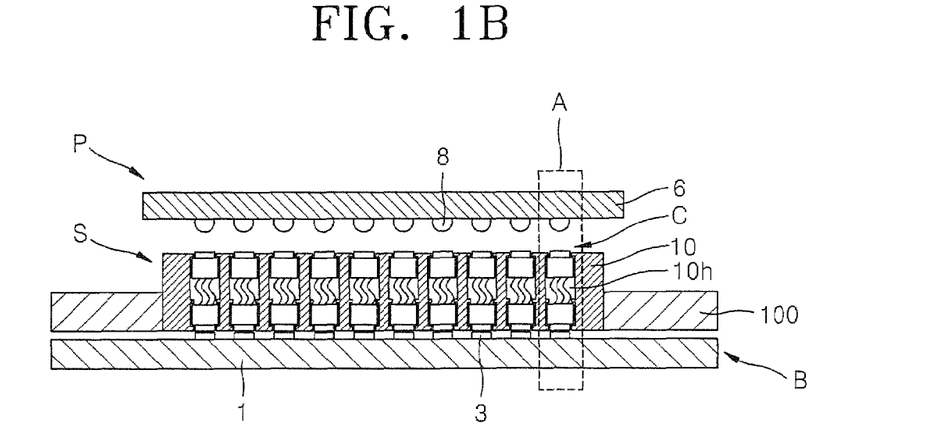

FIG. 1A and FIG. 1B show a plane view and a cross-sectional view, respectively, of a socket for testing a semiconductor package according to an example embodiment of the present invention. Referring to FIG. 1A and FIG. 1B, a socket S is provided in a central portion of a socket substrate 100. The socket S includes a body 10, which includes a plurality of through holes 10h, and contactors C, which are disposed in each of the through holes 10h.

The socket substrate 100 may be disposed on a test circuit substrate B. The test circuit substrate B may include a base substrate 1 and substrate contactors 3, which may be disposed on the base substrate 1. The substrate contactors 3 may be disposed to correspond to the contactors C. A semiconductor package P may be arranged for testing on the socket substrate 100. The semiconductor package P may include a package body 6 and package contactors 8, which are disposed on a lower surface of the package body 6. Each of the package contactors 8 may be a lead, a conductive ball, or a conductive bump. The package contactors 8 also are arranged to correspond to the contactors C.

Figure 2A:
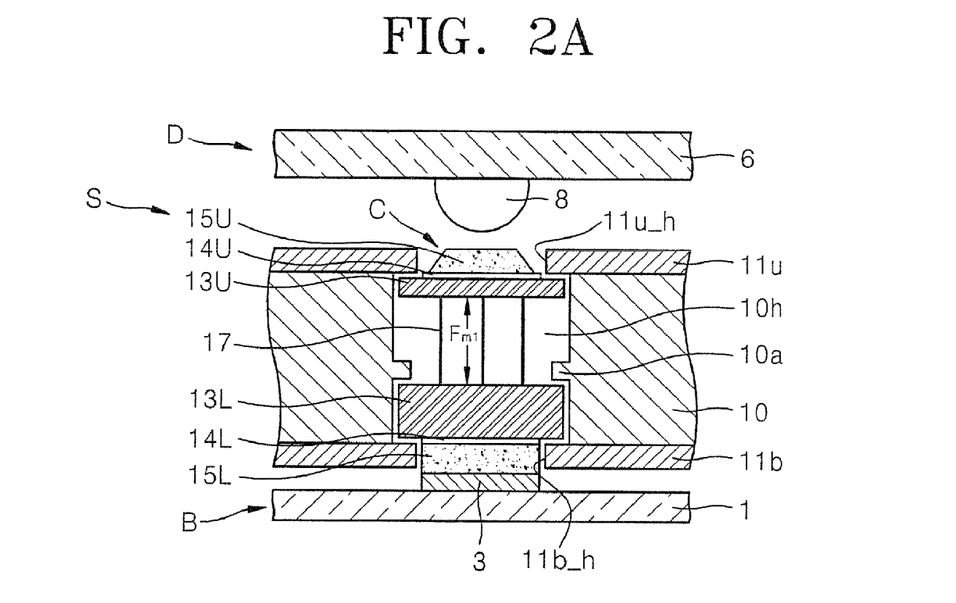
FIG. 2A and FIG. 2B show cross-sectional views sequentially illustrating the mounting of a semiconductor package on a socket for testing a semiconductor package of FIGS. 1A and 1B, according to an example embodiment of the present invention.
Figure 2B:
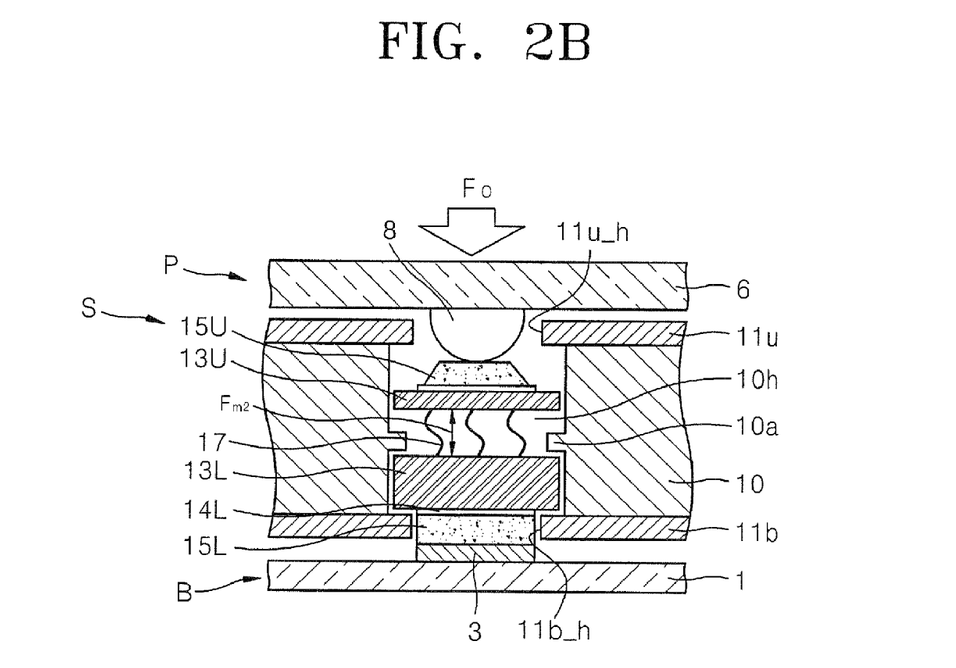

FIG. 2A and FIG. 2B show cross-sectional views sequentially illustrating the mounting of a semiconductor package on a socket for testing a semiconductor package of FIG. 1B, according to an example embodiment of the present invention. FIG. 2A and FIG. 2B are enlarged cross-sectional views of a portion A of FIG. 1B.

Referring to FIG. 2A, the body 10 of the socket may include a through hole 10h, and a lower magnet 13L is disposed in a lower region of the through hole 10h. The lower magnet 13L may be disposed such that a first type magnetic pole of the lower magnet 13L is directed upward. The first type magnetic pole may be an N pole or an S pole. An upper magnet 13U may be disposed in an upper region of the through hole 10h. The upper magnet 13U may be disposed such that the first type magnetic pole is directed toward the lower magnet 13L. As a result, the upper magnet 13U and the lower magnet 13L are disposed such that the same type of poles face each other. Thus, the upper magnet 13U and the lower magnet 13L are spaced apart from each other due to a repulsive force between them. The upper magnet 13U and the lower magnet 13L may be conductive magnets or permanent magnets.

The body 10 may include a protrusion 10a, which protrudes in towards the center of the through hole 10h. The protrusion 10a may serve to define a position of the lower magnet 13L. An upper plate 11u may be disposed on an upper surface of the body 10. The upper plate 11u is aligned with the through hole 10h and includes a hole 11u_h which is narrower than the through hole 10h. Therefore, the upper plate 11u may protrude beyond sidewalls of the through hole 10h thereby serving to define a position of the upper magnet 13U. A lower plate 11b may be disposed on a lower surface of the body 10. The lower plate 11b may be aligned with the through hole 10h and may include a hole 11b_h, which is narrower than the through hole 10h. Therefore, the lower plate 11b may protrude beyond the sidewalls of the through hole 10h thereby serving to define a position of the lower magnet 13L.

A conductive medium 17 may be disposed between the lower magnet 13L and the upper magnet 13U. The conductive medium 17 may form a current path between the lower magnet 13L and the upper magnet 13U, and may be comprised of conductive wires, which may be electrically coupled to the lower magnet 13L and the upper magnet 13U. The conductive wires may be a flexible. A contactor C may consist of the lower magnet 13L, the upper magnet 13U, and the conductive medium 17.

The upper magnet 13U may be a rigid body having very low flexibility. To this end, the upper magnet 13U may have a thickness of 0.5 mm or more. In this case, an upper conductive cushion 15U may be provided over the upper magnet 13U. The upper conductive cushion 15U may be formed of a conductive rubber, such as a pressure conductive rubber (PCR). The PCR is a rubber in which a plurality of conductive particles are arranged, and which exhibits a conductivity in a direction corresponding to a directional force applied to it. This upper conductive cushion 15U may have substantially a shape of trapezoid, the lower face of which is larger than the upper face thereof. Or the sides of conductive cushion 15U may be angled as a frustum of a cone.

The upper conductive cushion 15U may be adhered to the upper magnet 13U by a conductive adhesive film 14U. The conductive adhesive film 14U may be an adhesive film which is easily attachable or detachable. A lower conductive cushion 15L may be disposed under the lower magnet 13L. The lower conductive cushion 15L may be formed of a conductive rubber, such as PCR, like the upper conductive cushion 15U. The lower conductive cushion 15L may be adhered to the lower magnet 13L by a conductive adhesive film 14L.

The socket S may be fixed to the test circuit substrate B using a screw, or the like. As such, a fixing force is applied to the socket S due to the fixing means (e.g. the screw). The substrate contactor 3 may be coupled to the contactor C. For example, the lower conductive cushion 15L and a current path may be formed within the lower conductive cushion 15L by the fixing force applied to the socket S, so that the substrate contactor 3 and the lower magnet 13L are electrically coupled. At this time, the protrusion 10a may press the lower magnet 13L, so that the lower conductive cushion 15L can be sufficiently deformed by the force applied to the socket S. When the lower conductive cushion 15L is omitted, the lower magnet 13L and the substrate contactor 3 may be directly contacted and electrically coupled. However, when the lower conductive cushion 15L is formed, the lower conductive cushion 15L may absorb a shock wave which is generated when the lower magnet 13L and the substrate contactor 3 are directly contacted, so that damage of the substrate contactor 3 can be prevented. In addition, a good electrical coupling between the lower magnet 13L and the substrate contactor 3 may be embodied by the lower conductive cushion 15L.

Referring to FIG. 2B, an external force $F_o$ is applied to the semiconductor package P arranged on the socket S. The external force $F_o$ may be greater than an initial repulsive force Fm1 between the upper magnet 13U and the lower magnet 13L. To this end, the initial repulsive Fm1 is altered by adjusting the magnetism of the upper magnet 13U and the lower magnet 13L (or by adjusting a distance between the upper magnet 13U and the lower magnet 13L).

The package contactor 8 may be coupled to the contactor C by way of the upper conductive cushion 15U and the external force $F_o$. Furthermore, when the external force $F_o$ is greater than the initial repulsive force Fm1, the upper magnet 13U may be moved toward the lower magnet 13L by a predefined distance. As such, the upper magnet 13U may be pushed by the predefined distance such that damage to the package contactor 8 is prevented. In addition, the upper magnet 13U may be moved toward the lower magnet 13L by the predefined distance so that the modified repulsive force Fm2, having the same absolute value as that of the external force $F_o$, may be formed between the upper magnet 13U and the lower magnet 13L. Since the modified repulsive force Fm2 pushes the upper magnet 13U toward the package contactor 8, a current path may be formed within the upper conductive cushion 15U by means of the external force $F_o$ and the modified repulsive force Fm2, so that the package contactor 8 and the upper magnet 13U are electrically coupled to each other.

When the upper conductive cushion 15U is omitted, the upper magnet 13U and the package contactor 8 may be directly contacted and electrically coupled. However, when the upper conductive cushion 15U is included, the upper conductive cushion 15U may absorb the shock wave which is generated when the upper magnet 13U and the package contactor 8 are contacted. Therefore, damage to the package contactor 8 is prevented.

The external force $F_o$ applied to the semiconductor package P may be evenly dispersed by an upper conductive cushion 15U having substantially the trapezoid or frustum of a cone shape as described above. As a result, wear of the upper conductive cushion 15U may be reduced. However, over time the upper conductive cushion 15U can become considerably worn. This can be remedied by disassembling the socket and replacing the worn upper conductive cushion 15U with a new conductive cushion. To facilitate this remedial procedure, the conductive adhesive film 14U may be an adhesive film which is easy to attach and detach.

In this manner, the substrate contactor 3 and the lower magnet 13L may be electrically coupled, the lower magnet 13L and the upper magnet 13U may be electrically coupled by the conductive medium 17, and the upper magnet 13U and the package contactor 8 may be electrically coupled, such that the semiconductor package P and the test circuit substrate B are electrically coupled. Therefore, an electric signal may be applied to the test circuit substrate B in a way such that the electrical characteristics of the semiconductor package P can be tested.

After such a test is completed, the external force $F_o$ applied to the semiconductor package P may be removed. As a result, the repulsive force between the upper magnet 13U and the lower magnet 13L may be restored to the initial repulsive force Fm1. This restoring force may be substantially permanent so long as the upper magnet 13U and the lower magnet 13L are not damaged. Therefore, the durability of the contactor C is improved.

Figure 3A:
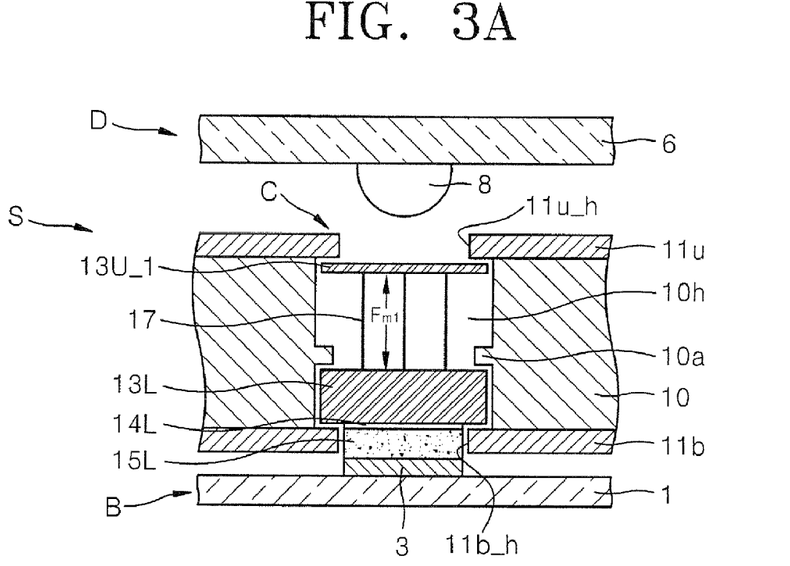
FIG. 3A and FIG. 3B show cross-sectional views sequentially illustrating the mounting of a semiconductor package on a socket for testing a semiconductor package according to another example embodiment of the present invention.
Figure 3B:
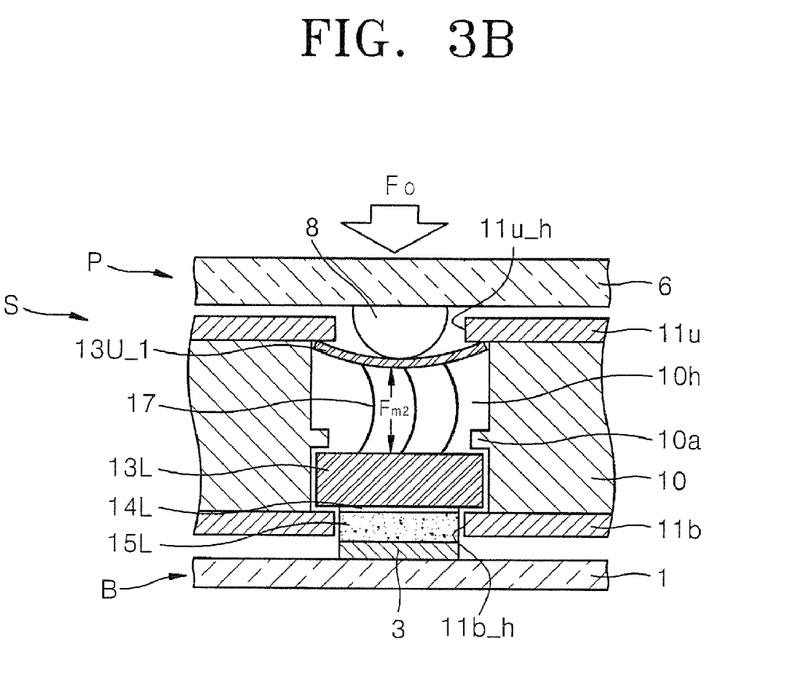

FIG. 3A and FIG. 3B show cross-sectional views sequentially illustrating the mounting of a semiconductor package on a socket for testing a semiconductor package according to another example embodiment of the present invention. The socket according to this example embodiment of the present invention is similar to those described with reference to FIG. 1A, FIG. 1B, FIG. 2A, and FIG. 2B, except for the details described below.

Referring to FIG. 3A, an upper magnet 13U_1 may be disposed in the upper region of the through hole 10h, and the upper magnet 13U_1 may be flexible. To this end, the upper magnet 13U_1 may have a thickness of about 0.2 mm to 0.3 mm.

The upper magnet 13U_1 is disposed such that the first type magnetic pole of the upper magnet 13U_1 may be directed towards the lower magnet 13L. The upper magnet 13U_1 and the lower magnet 13L may be disposed such that the same types of poles face each other. As a result, the upper magnet 13U_1 and the lower magnet 13L may be spaced apart from each other by the repulsive force between them. Also, conductive wires 17 may comprise a conductive medium disposed between the lower magnet 13L and the upper magnet 13U_1 to electrically couple the lower magnet 13L and the upper magnet 13U_1.

Referring to FIG. 3B, an external force $F_o$ may be applied to the semiconductor package P disposed on the socket S. The package contactor 8 may be contacted to the upper magnet 13U_1 such that the flexible upper magnet 13U_1 is bent downward. As a result, the shock wave which is generated when the package contactor 8 is contacted to the upper magnet 13U_1 is absorbed, such that damage to the package contactor 8 is prevented.

Figure 4A:
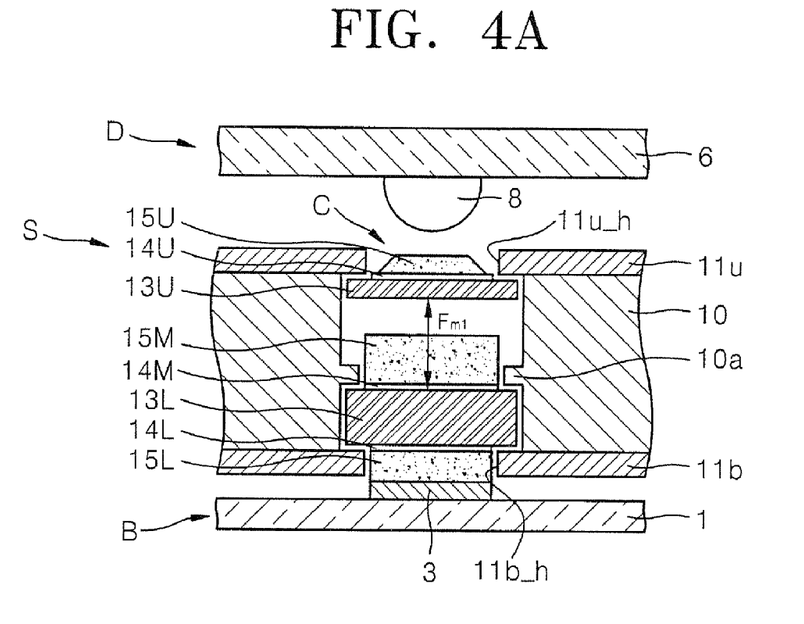
FIG. 4A and FIG. 4B show cross-sectional views sequentially illustrating the mounting of a semiconductor package on a socket for testing a semiconductor package according to another example embodiment of the present invention.
Figure 4B:
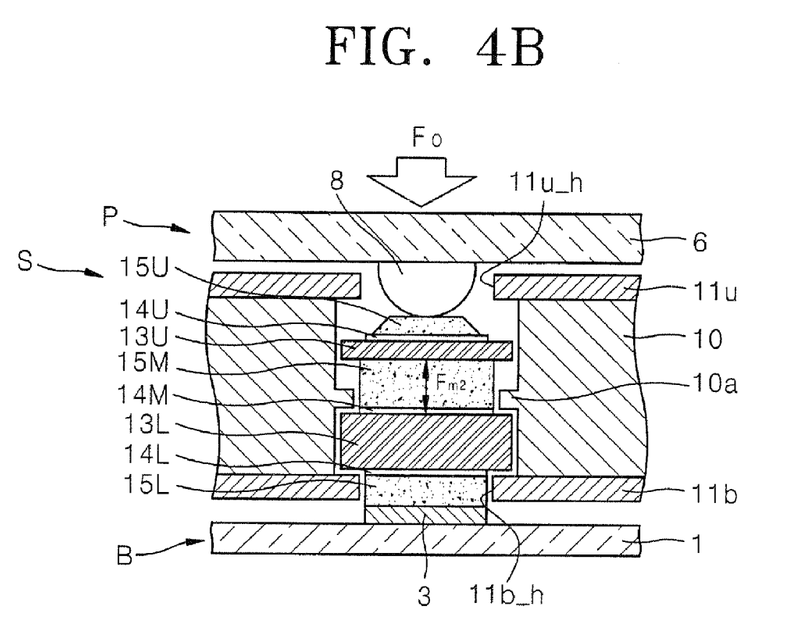

FIG. 4A and FIG. 4B show cross-sectional views sequentially illustrating the mounting of a semiconductor package on a socket for testing a semiconductor package according to another example embodiment of the present invention. The socket according to the current embodiment of the present invention is similar to those described with reference to FIG. 1A, FIG. 1B, FIG. 2A, and FIG. 2B, except for the details described below.

Referring to FIG. 4A, a central conductive cushion 15M comprising a conductive medium is disposed between the lower magnet 13L and the upper magnet 13U. The central conductive cushion 15M may be a conductive rubber such as Pressure Conductive Rubber (PCR). However, persons with skill in the art will recognize that other conductive materials can be used. The central conductive cushion 15M may be adhered to the lower magnet 13L by a conductive adhesive film 14M. As such, the central conductive cushion 15M may be spaced apart from the upper magnet 13U by a predefined interval. The conductive adhesive film 14M is preferably an adhesive film which is easy to attach and detach.

In an alternative example embodiment, the central conductive cushion 15M may be adhered to the upper magnet 13U by a conductive adhesive film. In this case, the central conductive cushion 15M may be spaced apart from the lower magnet 13L by a predefined interval.

Referring to FIG. 4B, an external force $F_o$ may be applied to the semiconductor package P disposed on the socket S. The package contactor 8 may be contacted to the contactor C by means of the upper conductive cushion 15U. The external force $F_o$ may be greater than an initial repulsive force Fm1 between the lower magnet 13L and the upper magnet 13U. Therefore, the upper magnet 13U is moved toward the lower magnet 13L by a predefined distance. The upper magnet 13U is pushed a predefined distance such that damage to the package contactor 8 is prevented. In addition, the upper magnet 13U may be contacted to the central conductive cushion 15M and a current path may be formed within the central conductive cushion 15M by means of the external force $F_o$, such that the upper magnet 13U and the lower magnet 13L are electrically coupled.

The external force $F_o$ applied to the semiconductor package P may be evenly dispersed by the upper conductive cushion 15U having substantially a trapezoid shape (or frustum of a cone shape), and the upper magnet 13U. Such dispersion may be uniformly applied to the central conductive cushion 15M such that wear of the central conductive cushion 15M, the upper conductive cushion 15U, and the upper magnet 13U, is reduced. However, when one or more of the central conductive cushion 15M, the upper conductive cushion 15U, and the upper magnet 13U becomes substantially worn, a remedial procedure can be performed. After disassembling the socket, the worn central conductive cushion 15M, upper conductive cushion 15U, or upper magnet 13U may be replaced with a new components. To this end, the conductive adhesive films 14M and 14U may be preferably easy to attach and detach.

Figure 5A:
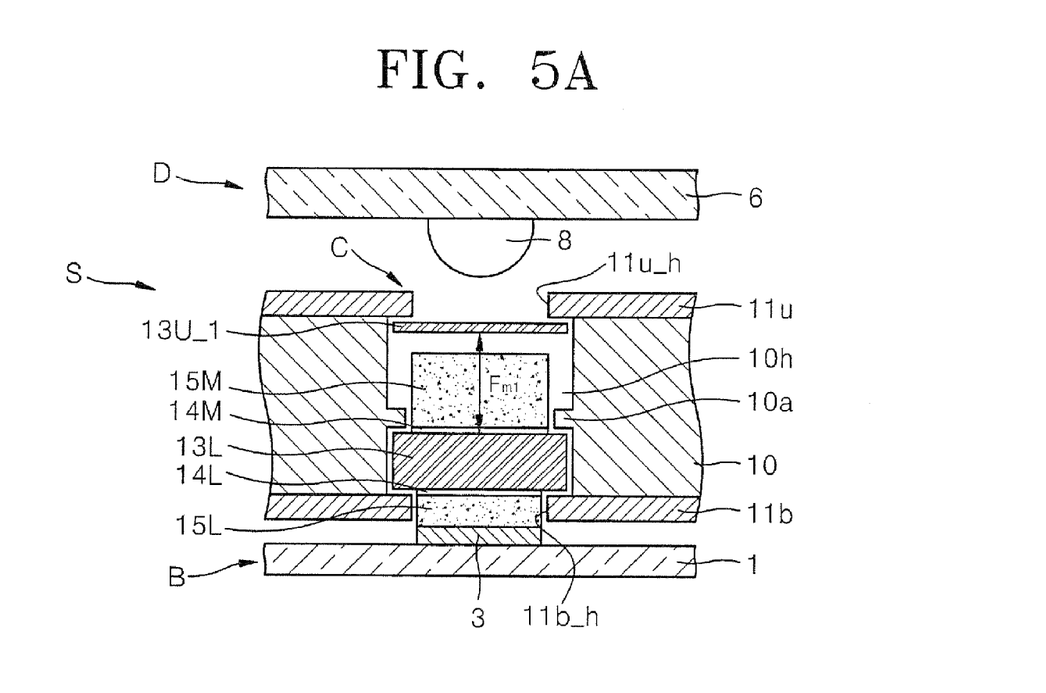
FIG. 5A and FIG. 5B show cross-sectional views sequentially illustrating the mounting of a semiconductor package on a socket for testing a semiconductor package according to another example embodiment of the present invention.
Figure 5B:
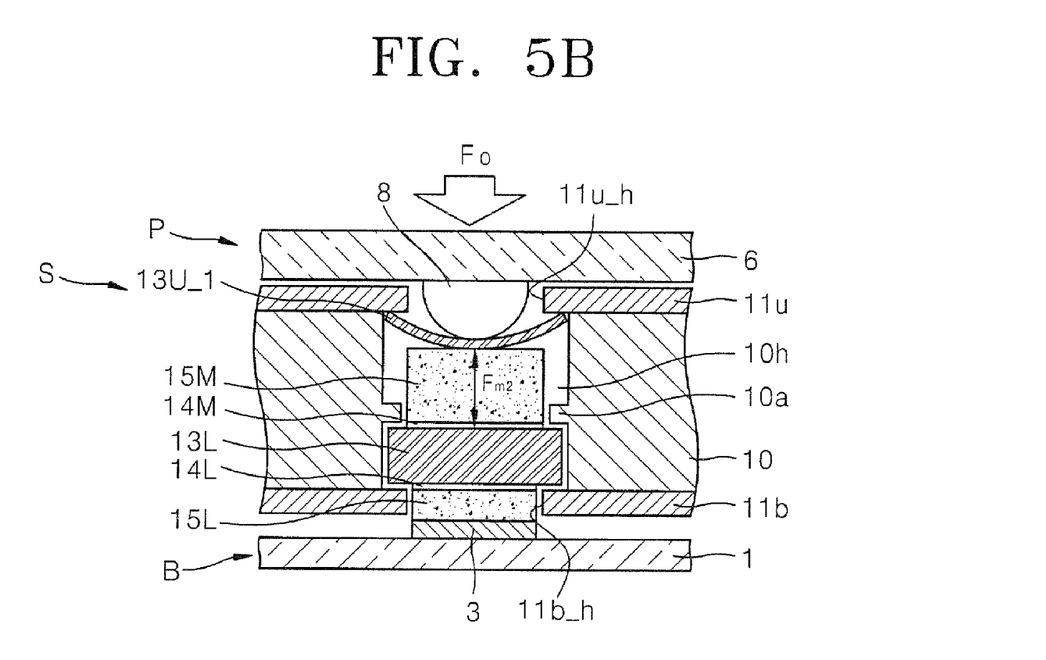

FIG. 5A and FIG. 5B show cross-sectional views sequentially illustrating the mounting of a semiconductor package on a socket for testing a semiconductor package according to another example embodiment of the present invention. The socket according to the current embodiment of the present invention is similar with those described with reference to FIG. 1A, FIG. 1B, FIG. 2A, and FIG. 2B, except for the details described below.

Referring to FIG. 5A, an upper magnet 13U_1, preferably flexible, may be disposed in an upper region of the through hole 10h. To this end, the upper magnet 13U_1 may have a thickness of about 0.2 mm to 0.3 mm.

The upper magnet 13U_1 may be disposed such that the first type magnetic pole of the upper magnet 13U_1 is directed toward the lower magnet 13L. Furthermore, the upper magnet 13U_1 and the lower magnet 13L may be disposed such that the same types of poles face each other. As a result, the upper magnet 13U_1 and the lower magnet 13L may be spaced apart from each other by the repulsive force between them.

Also, a central conductive cushion 15M comprising a conductive medium may be disposed between the lower magnet 13L and the upper magnet 13U_1. The central conductive cushion 15M may be a conductive rubber, such as PCR. However, persons with skill in the art will recognize that other conductive materials can be used. The central conductive cushion 15M may be adhered to the lower magnet 13L by the conductive adhesive film 14M. As such, the central conductive cushion 15M may be spaced apart from the upper magnet 13U_1 by a predefined interval. The conductive adhesive film 14M is preferably an adhesive film which is easy to attach and detach.

Referring to FIG. 5B, an external force $F_o$ may be applied to the semiconductor package P disposed on the socket S. As a result, a package contactor 8 may be contacted to the upper magnet 13U_1, and the flexible upper magnet 13U_1 may be bent downward. The shock wave which is generated when the package contactor 8 comes in contact to the upper magnet 13U_1 is absorbed such that damage to the package contactor 8 is prevented. The upper magnet 13U_1 (which may be bent), can make contact to the central conductive cushion 15M. Therefore, a current path may be formed within the central conductive cushion 15M, by means of the external force $F_o$, such that the upper magnet 13U_1 and the lower magnet 13L are electrically coupled.

As described above, according to example embodiments of the present invention, the elasticity of the contactor in a socket may be semi-permanently maintained by employing a pair of magnets repulsing each other as a contactor. As such, the repulsive force between the magnets may be employed as a shock absorber. The durability of the contactor (e.g., and as a result, the durability and dependability of the socket) is improved. In addition, damage to the package contactor is prevented through various embodiments which make use of flexible magnets or conductive cushions.

While the present invention has been particularly described with reference to exemplary embodiments thereof, it will be understood by those of ordinary skill in the art that the present invention is not limited to the embodiments as described above, and various changes and modifications may be made therein without departing from the spirit and the scope of the present invention as defined by the following claims.

What is claimed is:

1. A socket for testing a semiconductor package, the socket comprising:
    a body including a through hole;
    a first magnet disposed in a first region of the through hole such that a first type magnetic pole of the first magnet is directed in a first direction;
    a second magnet disposed in a second region of the through hole such that the first type magnetic pole of the second magnet is directed in a second direction; and
    a conductive medium disposed between the first magnet and the second magnet.

2. The socket of claim 1, wherein the first direction is opposite to the second direction, the conductive medium electrically couples the first magnet to the second magnet, and the first magnet is structured to absorb a shock wave by repelling the second magnet responsive to the semiconductor package being arranged for testing.

3. The socket of claim 2, further comprising a first conductive cushion disposed on a surface of the first magnet, the cushion being structured to further absorb the shock wave, and to electrically couple a base substrate of the socket to a contactor of the semiconductor package.

4. The socket of claim 3, further comprising a second conductive cushion which is disposed on a first surface of the second magnet.

5. The socket of claim 4, wherein the first surface of the second magnet is an upper surface and the second conductive cushion is adhered to the upper surface of the second magnet or a lower surface of the first magnet by a first conductive adhesive film.

6. The socket of claim 5, further comprising a third conductive cushion adhered to a second surface of the second magnet by a second conductive adhesive film, the third conductive cushion being electrically coupled to the base substrate using a substrate contactor.

7. The socket of claim 3, wherein the first conductive cushion is adhered to the first magnet by a conductive adhesive film.

8. The socket of claim 7, wherein the first conductive cushion is formed substantially in the shape of a trapezoid.

9. The socket of claim 7, wherein the first conductive cushion is formed substantially in the shape of a frustum of a cone.

10. The socket of claim 1, wherein the first magnet is flexible.

11. The socket of claim 1, wherein the conductive medium includes at least one conductive wire which is coupled to the first magnet and the second magnet.

12. The socket of claim 1, wherein the conductive medium includes a conductive cushion disposed between the first magnet and the second magnet.

13. The socket of claim 1, wherein the body further includes a protrusion which protrudes inward toward the center of the through hole and secures a position of the second magnet.

14. The socket of claim 1, further comprising an upper plate which is disposed on an upper surface of the body and includes a hole which is aligned with the through hole and is narrower than the through hole.

15. The socket of claim 1, further comprising a lower plate which is disposed on a lower surface of the body and includes a hole which is aligned with the through hole and is narrower than the through hole.

16. A socket for testing a semiconductor package, the socket comprising:
    a body including a through hole;
    a lower magnet disposed in a lower region of the through hole such that a first type magnetic pole of the lower magnet is directed upward;
    an upper magnet disposed in an upper region of the through hole such that the first type magnetic pole of the upper magnet is directed toward the lower magnet;
    an upper conductive cushion which is disposed on an upper surface of the upper magnet;
    a lower conductive cushion which is disposed on a lower surface of the lower magnet; and
    a conductive medium disposed between the lower magnet and the upper magnet.

17. The socket of claim 16, wherein the upper conductive cushion is adhered to the upper magnet by a conductive adhesive film.

18. The socket of claim 16, wherein the upper conductive cushion is formed substantially in the shape of a trapezoid, a lower face of which is larger than an upper face thereof.

19. The socket of claim 16, wherein the upper conductive cushion is formed substantially in the shape of a frustum of a cone.

20. The socket of claim 16, wherein the conductive medium includes at least one conductive wire which is coupled to the lower magnet and the upper magnet.

21. The socket of claim 16, wherein the conductive medium includes a central conductive cushion which is adhered to an upper surface of the lower magnet or to a lower surface of the upper magnet.

22. The socket of claim 21, wherein the central conductive cushion is adhered to the upper surface of the lower magnet or the lower surface of the upper magnet by a conductive adhesive film.

23. A socket for testing a semiconductor package, the socket comprising:
    a body including a through hole;

a lower magnet disposed in a lower region of the through hole such that a first type magnetic pole of the lower magnet is directed upward;

a flexible upper magnet disposed in an upper region of the through hole such that the first type magnetic pole of the upper magnet is directed toward the lower magnet; and a conductive medium disposed between the lower magnet and the upper magnet.

24. The socket of claim 23, wherein a lower conductive cushion is disposed on a lower surface of the lower magnet.

25. The socket of claim 23, wherein the conductive medium includes at least one conductive wire which is coupled to the lower magnet and the upper magnet.

26. The socket of claim 23, wherein the conductive medium includes a central conductive cushion which is adhered to an upper surface of the lower magnet or to a lower surface of the upper magnet by a conductive adhesive film.

* * * * *